United States Patent
Wipiejewski

(10) Patent No.: US 6,716,659 B2
(45) Date of Patent: Apr. 6, 2004

(54) METHOD AND APPARATUS FOR SHAPING SEMICONDUCTOR SURFACES

(75) Inventor: Torsten Wipiejewski, Santa Barbara, CA (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/899,697

(22) Filed: Jul. 5, 2001

(65) Prior Publication Data

US 2002/0048956 A1 Apr. 25, 2002

Related U.S. Application Data

(63) Continuation of application No. PCT/DE00/00009, filed on Jan. 3, 2000.

(30) Foreign Application Priority Data

Jan. 4, 1999 (DE) .......................... 199 00 051

(51) Int. Cl.[7] .......................... H01L 31/04; H01L 21/00
(52) U.S. Cl. .................. 438/44; 438/29; 438/42
(58) Field of Search .................. 438/691, 29, 42, 438/44

(56) References Cited

U.S. PATENT DOCUMENTS

| | | | |
|---|---|---|---|
| 4,240,311 A | 12/1980 | Shinn | |
| 4,829,013 A | 5/1989 | Yamazaki | |
| 5,250,466 A | * 10/1993 | Gerner et al. | ................ 437/184 |
| 5,306,646 A | 4/1994 | Lauf | |
| 5,378,289 A | 1/1995 | Noguchi et al. | |
| 5,895,225 A | * 4/1999 | Kidoguchi et al. | ........... 438/47 |
| 6,255,004 B1 | * 7/2001 | Yoshida | ..................... 428/627 |
| 6,319,742 B1 | * 11/2001 | Hayashi et al. | ............... 438/46 |

FOREIGN PATENT DOCUMENTS

| | | |
|---|---|---|
| DE | 196 24 593 A1 | 1/1998 |
| EP | 0 757 262 A1 | 2/1997 |
| GB | 737950 | 10/1955 |
| GB | 2 090 237 A | 7/1982 |
| JP | 56103484 | 8/1981 |
| JP | 57 135 723 | 8/1982 |
| JP | 59 141 500 A | 8/1984 |
| JP | 60-16426 A | 1/1985 |
| JP | 0620226900 AA | 10/1987 |
| JP | 3 085 774 A | 4/1991 |
| JP | 6 056 442 A | 3/1994 |
| JP | 07232319 | 9/1995 |
| JP | 40-8018166 | * 1/1996 ............. H01S/3/18 |

OTHER PUBLICATIONS

GaAs to InP wafer fusion; Ram et al.; Journal of Applied Physics; Sep. 15, 1995, vol. 78, Issue 6 pp. 4227–4237.*

* cited by examiner

*Primary Examiner*—Amir Zarabian
*Assistant Examiner*—Pamela E Perkins
(74) *Attorney, Agent, or Firm*—Laurence A. Greenberg; Werner H. Stemer; Gregory L. Mayback

(57) ABSTRACT

A method and an apparatus for shaping semiconductor surfaces, in which a semiconductor wafer with a surface to be shaped is clamped in-between two plates. In which case at least one plate has a negative form with respect to the desired form to be formed in a semiconductor surface and the semiconductor surface is pressed by the plates at an elevated temperature. The method can be used particularly advantageously for fabricating concave microlens structures in semiconductor surfaces.

11 Claims, 4 Drawing Sheets

METHOD AND APPARATUS FOR SHAPING SEMICONDUCTOR SURFACES

CROSS-REFERENCE TO RELATED APPLICATION

This application is a continuation of copending International Application No. PCT/DE00/00009, filed Jan. 3, 2000, which designated the United States.

BACKGROUND OF THE INVENTION

Field of the Invention

The invention relates to a method for shaping semiconductor surfaces and an apparatus for carrying out the method.

Optical microcomponents such as e.g. microlenses and microlens arrays have been used for many years in optoelectronics. Convex microlenses can be produced in a particularly simple manner using resoftened photoresist structures (photoresist reflow). The convex forms form automatically during heating as a result of the surface tension in the photoresist and can be transferred by dry etching methods e.g. in silicon semiconductor wafers. The reproducible fabrication of concave structures is significantly more difficult, because a self-aligning photoresist process such as reflow is not available. However, concave microlenses could advantageously be used in numerous applications, such as e.g. for correcting the astigmatism of the output radiation of edge-emitting laser diodes. Usually, an attempt is made to produce concave structures by wet-chemical etching methods utilizing diffusion effects. Owing to poor reproducibility and inadequate surface quality, such methods have not, to date, gained admittance to applications on an industrial scale.

U.S. Pat. No. 5,378,289 describes a method for shaping a semiconductor surface in which a surface made of an amorphous silicon is simultaneously deformed and crystallized by a textured pressure mold which is made of a crystalline silicon and is provided with pyramids being pressed into the amorphous silicon surface under the action of heat. This makes it possible to fabricate a crystalline silicon film that has a textured surface corresponding to the textured surface of the mold used for the pressing process.

SUMMARY OF THE INVENTION

It is accordingly an object of the invention to provide a method and an apparatus for shaping semiconductor surfaces which overcome the above-mentioned disadvantages of the prior art methods and devices of this general type, which specifies a simple and cost-effective method which can be used to achieve the shaping of semiconductor surfaces. In particular, it is an object of the present invention to produce concave surface structures by a method of this type.

With the foregoing and other objects in view there is provided, in accordance with the invention, a method for shaping semiconductor surfaces. The method includes the steps of providing a semiconductor wafer having a semiconductor surface to be shaped and formed of a compound semiconductor material and clamping the semiconductor wafer in-between two plates. At least one of the plates has a negative form with respect to a desired form to be formed in the semiconductor surface. The semiconductor surface is pressed by the two plates at an elevated temperature and the method is carried out in an atmosphere enriched with an element of the compound semiconductor material.

Accordingly, the present invention relates to a method for shaping semiconductor surfaces, in which a semiconductor wafer with a surface to be shaped is clamped in between the two plates. In which case at least one plate has a negative form with respect to the desired form of the semiconductor surface, and the semiconductor surface is pressed by the plates at an elevated temperature.

Preferably, in this case a first plate has the negative form with respect to the desired form of the semiconductor surface and a second plate has a planar area.

In order to obtain the pressing action, a pressure can be exerted on at least one of the two plates, or on both plates, in a direction perpendicular to the semiconductor wafer. The pressure according to the properties of the semiconductor material to be formed is preferably greater than 1 MPa and the temperature preferably is greater than 600° C.

The pressing process can be carried out in an inert-gas or protective-gas atmosphere, for example nitrogen gas or argon gas. If the semiconductor material to be shaped is a compound semiconductor, it is possible, in order to prevent decomposition of the compound semiconductor, to use an atmosphere enriched with an element of the compound semiconductor during the shaping. By way of example, if GaAs is used as the semiconductor to be shaped, the method can be carried out in an atmosphere enriched with arsenic.

In the manner according to the invention, it is possible to fabricate diverse forms such as convex or concave structures in a round or sharp-edged embodiment. In this case, the entire semiconductor wafer can be structured at the same time, thereby ensuring cost-effective mass production.

With the foregoing and other objects in view there is provided, in accordance with the invention, a method for fabricating a light-emitting diode. The method includes the steps of providing a semiconductor wafer having a semiconductor surface to be shaped and clamping the semiconductor wafer in-between two plates. At least one of the plates has a negative form with respect to a desired form to be formed in the semiconductor surface. The semiconductor surface is pressed using the two plates at an elevated temperature, resulting in a structure having at least one curved depression produced in the semiconductor surface. An active layer sequence is grown on a section containing the curved depression. The structure is provided with electrical contacts.

In accordance with an added mode of the invention, there is the step of forming the negative form to have convex structures for producing concave structures in the semiconductor surface.

In accordance with an additional mode of the invention, there is the step of growing a Bragg reflector layer sequence before performing the step of growing the active layer sequence on the section containing the curved depression. A further Bragg reflector layer sequence can be grown after the step of growing the active layer sequence on the section containing the curved depression resulting in a vertical resonator laser diode being produced.

With the foregoing and other objects in view there is further provided, in accordance with the invention, an apparatus for shaping semiconductor surfaces. The apparatus includes two plates. At least one of the two plates has a negative form with respect to a desired form to be formed in a semiconductor surface of a semiconductor wafer. A pressing apparatus is provided for exerting a pressure on at least one of the two plates in a direction perpendicular to the semiconductor wafer disposed between the two plates. Dome-shaped structures for distributing a compressive force are disposed on that side of the two plates which is remote from the semiconductor wafer.

In accordance with a further feature of the invention, the two plates include a first plate having the negative form and a second plate with a planar area.

In accordance with an added feature of the invention, the two plates are formed of a material, and at a shaping temperature, the semiconductor wafer to be pressed has a lower hardness than the material of the two plates.

In accordance with a concomitant of the invention, the two plates are formed of silicon, metal, or molybdenum.

Other features which are considered as characteristic for the invention are set forth in the appended claims.

Although the invention is illustrated and described herein as embodied in a method and an apparatus for shaping semiconductor surfaces, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
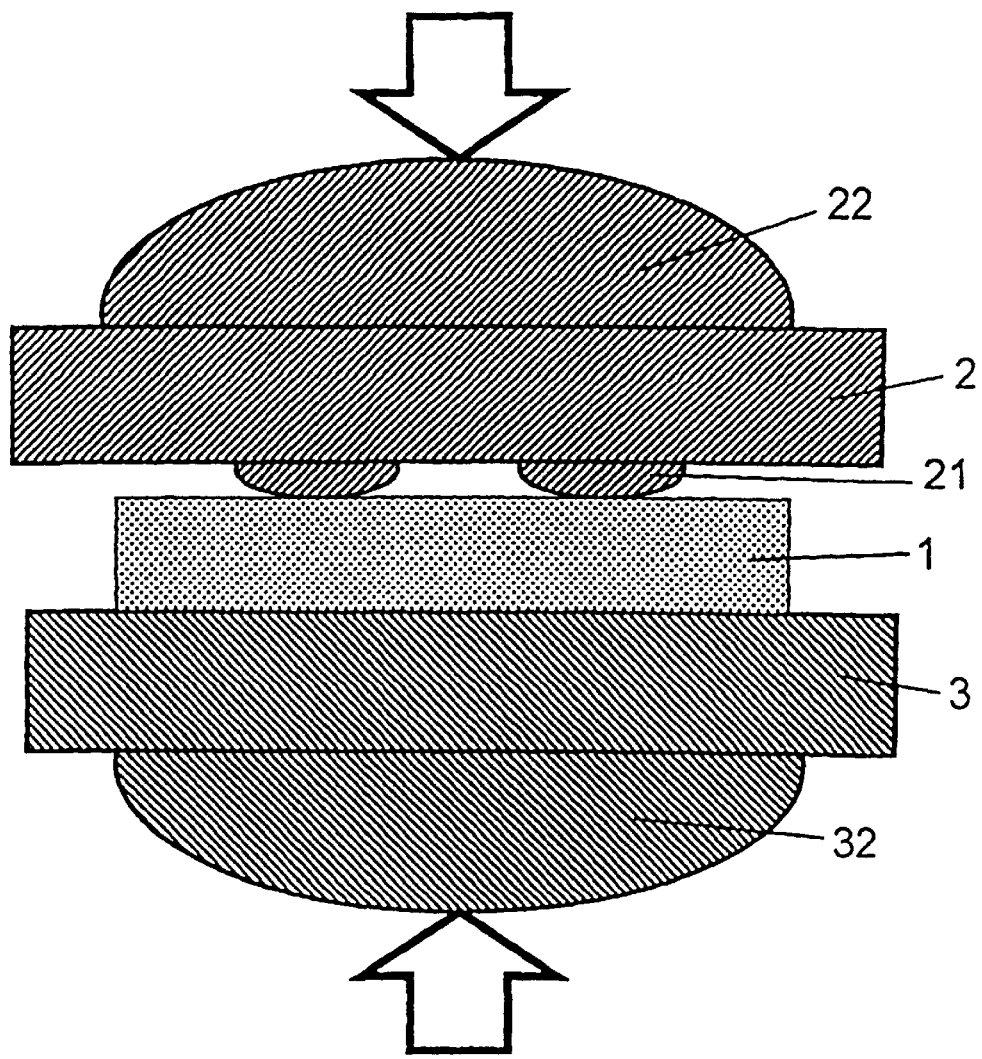
FIG. 1 is a diagrammatic, sectional view of an exemplary embodiment of an apparatus for carrying out the method according to the invention.

In all the figures of the drawing, sub-features and integral parts that correspond to one another bear the same reference symbol in each case. Referring now to the figures of the drawing in detail and first, particularly, to FIG. 1 thereof, there is shown an exemplary embodiment of an apparatus for carrying out the method according to the invention. In the apparatus, a semiconductor wafer 1 to be shaped is clamped in between two plates 2, 3, of which the first plate 2 is the shaping plate and the second plate 3 serves for retaining or supporting the semiconductor wafer 1. The first shaping plate 2 has a surface structure that constitutes a negative form of a desired form of the semiconductor wafer 1. As is illustrated by way of example, a surface structure may have convex bulges 21 by which concave depressions are intended to be produced by the shaping process in the semiconductor surface. As is further illustrated, a pressing apparatus diagrammatically illustrated by the arrows, can exert a mutually opposite compressive force on the two plates 2, 3 in a direction perpendicular to the semiconductor wafer 1, so that the shaping plate 2 with the surface structure 21 is pressed into the semiconductor surface during the pressing process at an elevated temperature. A total pressure that has to be expended for this purpose depends on the semiconductor materials of the semiconductor wafer 1 and the plates 2, 3 and also on the ambient temperature. The publication titled "GaAs to InP Wafer Fusing" in J. Appl. Phys., in Vol. 78, pages 4227–4237 from 1995, by R. J. Ram et al., discloses that pressures above 1 MPa and temperatures above 600° C. are necessary in the chemical bonding of two different semiconductor materials, namely GaAs and InP. It can therefore be expected that the conditions must be chosen in this way in the case of the method according to the invention as well. In order to facilitate the process conditions, at a given shaping temperature, the semiconductor material to be shaped should have a lower hardness than the plate material.

Figure 2:
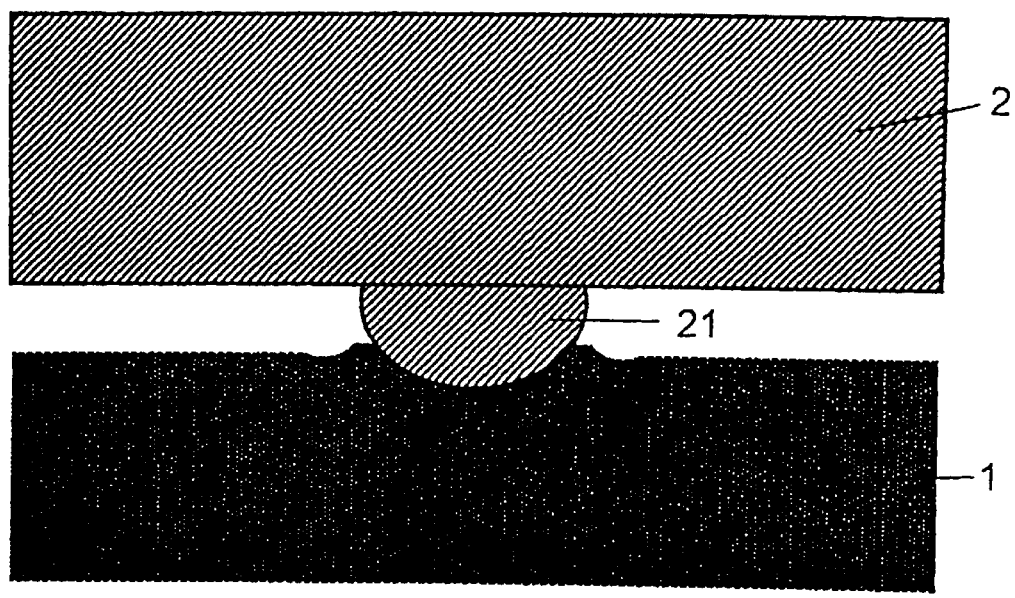
FIG. 2 is an enlarged sectional view showing a press-shaping process.

FIG. 2 once again illustrates the shaping process, on an enlarged scale. The atoms of the semiconductor wafer 1 to be pressed yield laterally under the high pressure and thus form a negative replica of the surface profile of the shaping plate 2.

It is advantageous if the compressive force to be expended at the two plates 2, 3 is distributed as uniformly as possible between the plates 2, 3. Therefore, the compressive force, as is indicated by the arrows, is provided essentially along a line perpendicular to the semiconductor wafer 1. The dome-like structures 22, 32 are for laterally distributing the compressive-force action between the plates and are preferably applied on both plates 2, 3.

In order to simplify the construction of the pressing apparatus, it may also be provided that a compressive force is exerted only on one of the two plates 2, 3.

Furthermore, it may be provided that the shaping process is carried out under an inert-gas or protective-gas atmosphere, for example under nitrogen or argon. If a compound semiconductor is intended to be shaped, then decomposition of the compound semiconductor may occur in an undesirable manner during the shaping process. Therefore, it is advantageous in such cases if an atmosphere enriched with an element of the compound semiconductor is produced during the shaping process. During the shaping of a III–V semiconductor such as GaAs, it is possible, by way of example, to use an atmosphere enriched with the group V element (arsenic). Decomposition can be effectively prevented as a result.

Depending on the application, the first shaping plate 2 may be composed of silicon or a metal, such as molybdenum, or other suitable substances. The shaping plate 2 is processed prior to the shaping process in such a way as to produce the correspondingly negative surface profile 21 with respect to the desired surface profile of the semiconductor wafer 1. For this purpose, etching processes or other grinding or polishing methods can be used, depending on the plate material. By way of example, it is possible to use silicon wafers patterned by dry etching technology, the wafers containing convex microlenses, in order to produce concave lens structures in the semiconductor wafer 1 to be pressed.

Figure 3:
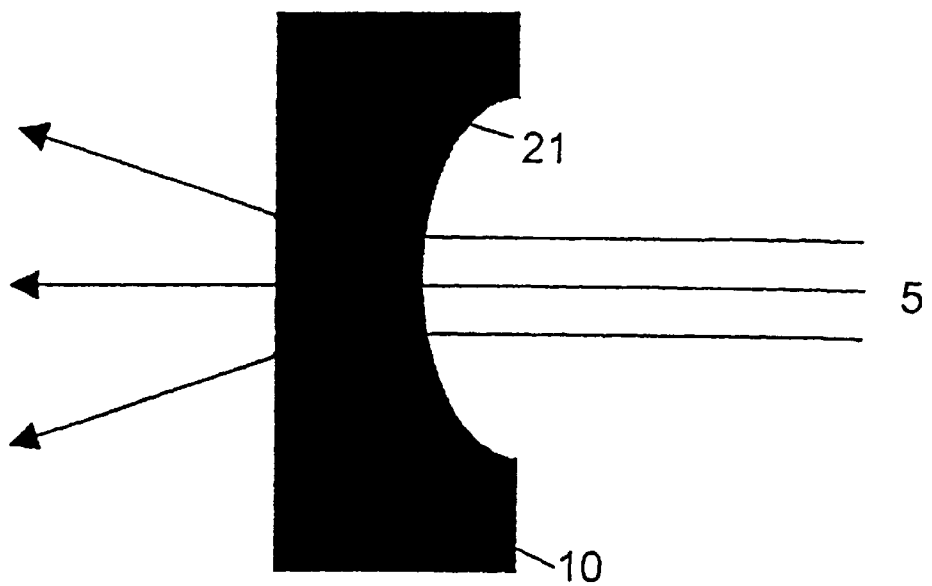
FIG. 3 is an illustration of a concave lenses fabricated by the method according to the invention.

An example of a concave lens structure of this type is illustrated in FIG. 3, which shows a concave microlens 10 produced from the semiconductor compounds GaP. The microlens having been produced by the method according to the invention. The microlens 10 essentially has a curved, concave depression 11 shaped by the method according to the invention. The semiconductor compound GaP has the advantage that, with an appropriate thickness, it has low absorption for visible light and is thus virtually transparent and, in addition, has a very high refractive index compared with glass. Therefore, as illustrated in FIG. 3, the concave microlens 10 refracts the light rays 5 to a very great extent as they pass through.

Figure 4:
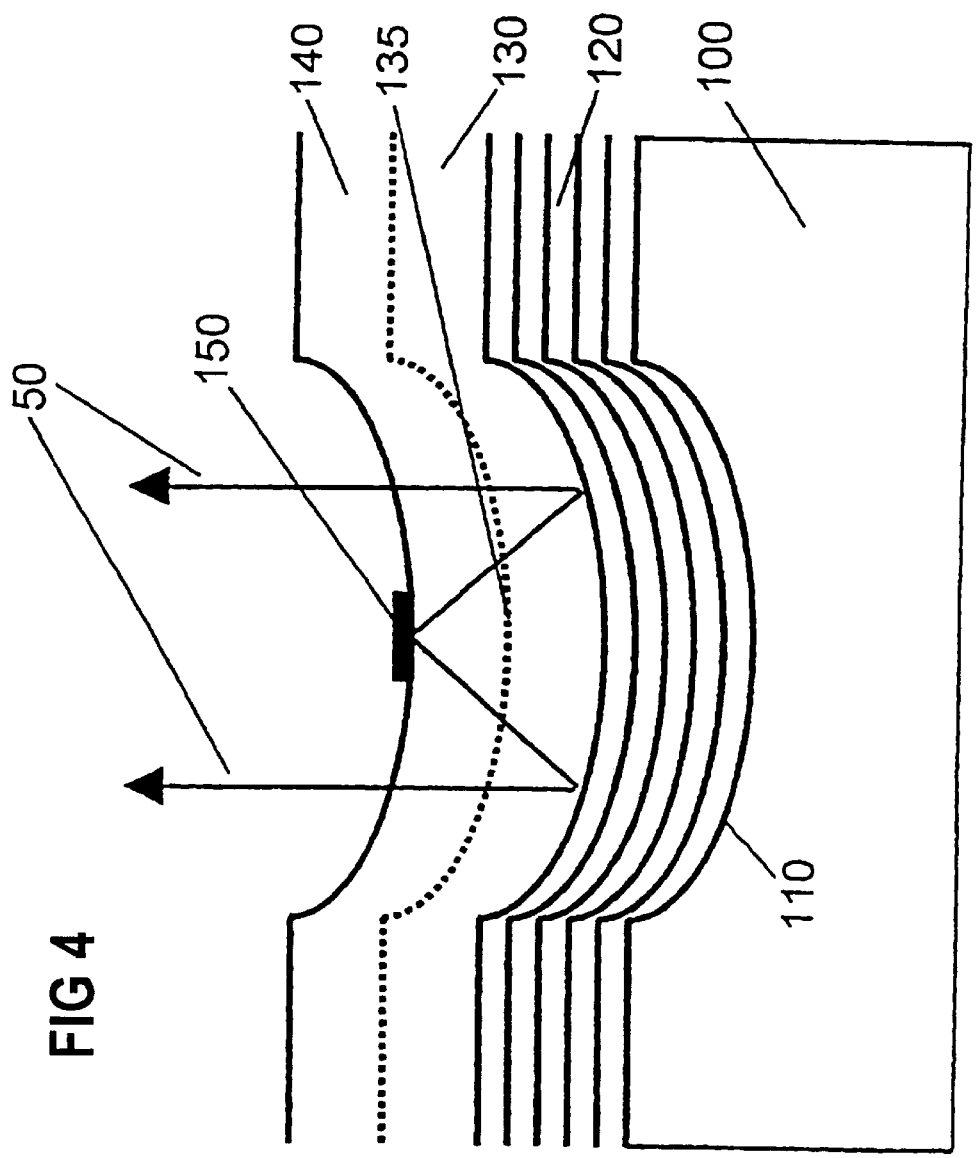
FIG. 4 is an illustration of a vertical resonator light-emitting diode fabricated by the method according to the invention.

In a further application, the method according to the invention can serve for fabricating light-emitting diodes or laser diodes. In this case, concave structures are produced on the semiconductor wafer 1 and, on this basis, further process steps for fabricating the light-emitting diode or laser diode are carried out. FIG. 4 illustrates a light-emitting diode fabricated in this way, which uses an n-conducting GaAs substrate 100 as a starting material, a curved depression 110 having been shaped into the substrate 100 by the method according to the invention. In a further process step, a Bragg reflector layer sequence 120 is then grown epitaxially on at least one section containing the depression 110. An active layer sequence containing an n-doped layer 130 and a p-doped layer 140 is then grown epitaxially on the structure. The layer sequence contains a light-generating pn junction 135 at the interface of the layers 130 and 140. Power is supplied through a p-type contact 150 fitted on the p-type side and an n-type contact (not illustrated) fitted on the n-type substrate 100.

The output radiation radiated downward by the light-generating pn junction is reflected largely perpendicularly to the surface by the curved Bragg reflector, thereby producing a high coupling-out efficiency. However, it is also possible to dispense with the Bragg reflector layer sequence, so that only the active layer sequence with the pn junction 135 is grown on the depression 110 acting as microlens.

Furthermore, the structure shown in FIG. 4 can, however, also be developed to form a vertical resonator laser diode. To that end, it is necessary merely to deposit expitaxially above the active layer sequence a second Bragg reflector layer sequence for forming a resonator. Afterward, it is possible to carry out the structuring of the vertical resonator laser diode using the known methods of the art.

I claim:

1. A method for fabricating a light-emitting diode, which comprises the steps of:
   providing a semiconductor wafer having a semiconductor surface to be shaped;
   clamping the semiconductor wafer in-between two plates, at least one of the plates having a negative form with respect to a desired form to be formed in the semiconductor surface;
   pressing the semiconductor surface using the two plates at an elevated temperature, resulting in a structure having at least one curved depression produced in the semiconductor surface;
   growing a highly reflective layer on a section containing the curved depression;
   after growing the highly reflective layer, growing an active layer sequence on the section containing the curved depression; and
   providing the structure with electrical contacts.

2. The method according to claim 1, which comprises forming the structure as a microlens.

3. The method according to claim 1, which comprises forming a first plate of the two plates with the negative form for producing the desired form in the semiconductor surface of the semiconductor wafer and forming a second plate of the two plates with a planar area.

4. The method according to claim 1, which comprises exerting a pressure, to obtain a pressing action, on at least one of the two plates in a direction perpendicular to the semiconductor wafer.

5. The method according to claim 4, which comprises exerting the pressure on both of the two plates in the direction perpendicular to the semiconductor wafer.

6. The method according to claim 4, which comprises setting the pressure to be greater than 1 MPa and the elevated temperature to be greater than 600° C.

7. The method according to claim 1, which comprises carrying out the method in an atmosphere selected from the group consisting of an inert gas atmosphere, a protective-gas atmosphere, a nitrogen gas atmosphere and an argon gas atmosphere.

8. The method according to claim 7, which comprises:
   using GaAs as the compound semiconductor material; and
   selecting the atmosphere to be enriched with arsenic.

9. The method according to claim 1, which comprises forming the negative form to have convex structures for producing concave structures in the semiconductor surface.

10. The method according to claim 1, which comprises growing a Bragg reflector layer sequence before performing the step of growing the active layer sequence on the section containing the curved depression.

11. The method as claimed in claim 10, which comprises growing a further Bragg reflector layer sequence after the step of growing the active layer sequence on the section containing the curved depression resulting in a vertical resonator laser diode being produced.

* * * * *